United States Patent
Fujiwara

(10) Patent No.: US 9,130,592 B2
(45) Date of Patent: Sep. 8, 2015

(54) ERROR CORRECTION CODE CIRCUIT AND MEMORY DEVICE INCLUDING THE SAME

(71) Applicant: SAMSUNG ELECTRONICS CO., LTD., Suwon-si, Gyeonggi-do (KR)

(72) Inventor: Daisuke Fujiwara, Yokohama (JP)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 142 days.

(21) Appl. No.: 14/054,190

(22) Filed: Oct. 15, 2013

(65) Prior Publication Data

US 2014/0108895 A1    Apr. 17, 2014

(30) Foreign Application Priority Data

Oct. 15, 2012    (JP) .................. 2012-227834

(51) Int. Cl.
*H03M 13/15*    (2006.01)
*H03M 13/11*    (2006.01)
(Continued)

(52) U.S. Cl.
CPC ........... *H03M 13/1545* (2013.01); *G06F 11/08* (2013.01); *G06F 11/10* (2013.01); *G06F 11/1008* (2013.01); *G06F 11/1048* (2013.01); *G06F 11/1068* (2013.01); *G11C 29/04* (2013.01); *H03M 13/1148* (2013.01); *H03M 13/151* (2013.01); *H03M 13/152* (2013.01); *H03M 13/153* (2013.01); *H03M 13/154* (2013.01); *H03M 13/158* (2013.01); *H03M 13/1515* (2013.01); *H03M 13/1575* (2013.01);
(Continued)

(58) Field of Classification Search
CPC ..................... H03M 13/1545; H03M 13/1515; H03M 13/152; H03M 13/1148; H03M 13/154; H03M 13/6566; H03M 13/151; H03M 13/153; H03M 13/1575; H03M 13/3707; G06F 11/10; G06F 11/1008; G06F 11/1048; G06F 11/08; G06F 11/1068; G11C 29/04; G11C 8/10
USPC ......... 714/781, 785, 784, 752, 763, 758, 773, 714/774, 799; 365/185.09; 708/492
See application file for complete search history.

(56) References Cited

U.S. PATENT DOCUMENTS 6,279,137 B1    8/2001    Poeppelman et al.
6,487,691 B1 *    11/2002    Katayama et al. ............ 714/784
(Continued)

FOREIGN PATENT DOCUMENTS

JP    H0388431 A    4/1991
JP    H0423522 A    1/1992
(Continued)

*Primary Examiner* — John J Tabone, Jr.
(74) *Attorney, Agent, or Firm* — Lee & Morse, P.C.

(57) ABSTRACT

The ECC circuit includes a Chien search unit configured to determine whether there is an error in each bit of a data sequence. The Chien search unit selects a coefficient of a nonlinear term from among terms of an error locator polynomial as a nonlinear coefficient, separates the error locator polynomial into a first location equation including only linear terms and a second location equation including only nonlinear terms, determines a third location equation by dividing the first location equation by the nonlinear coefficient, determines a fourth location equation by dividing the second location equation by the nonlinear coefficient, and determines whether there is an error for each of the bits by performing an XOR operation on a result of the third location equation using the substitution value and a result of the fourth location equation using an arbitrary element of the error locator polynomial as a substitution value.

8 Claims, 12 Drawing Sheets

(51) Int. Cl.
  *G06F 11/10* (2006.01)
  *G11C 29/04* (2006.01)
  *H03M 13/00* (2006.01)
  *H03M 13/37* (2006.01)
  *G06F 11/08* (2006.01)
  *H03M 13/19* (2006.01)

(52) U.S. Cl.
  CPC .......... *H03M 13/19* (2013.01); *H03M 13/3707* (2013.01); *H03M 13/6566* (2013.01)

(56) References Cited

U.S. PATENT DOCUMENTS

| | | | |
|---|---|---|---|
| 6,639,865 B2* | 10/2003 | Kwon | 365/230.03 |
| 7,055,087 B2* | 5/2006 | Kwon et al. | 714/784 |
| 7,096,408 B1* | 8/2006 | Ireland et al. | 714/784 |
| 7,406,651 B2* | 7/2008 | Yoon | 714/784 |
| 7,458,007 B2 | 11/2008 | Sankaran et al. | |
| 7,865,809 B1 | 1/2011 | Lee et al. | |
| 8,060,809 B2 | 11/2011 | Hsu | |
| 8,091,010 B2* | 1/2012 | Yim | 714/773 |
| 8,099,656 B2 | 1/2012 | Ryu | |
| 8,327,241 B2 | 12/2012 | Wu et al. | |
| 8,990,667 B2* | 3/2015 | Kuriyama | 714/785 |
| 9,013,921 B2* | 4/2015 | Miyamoto et al. | 365/185.09 |
| 2002/0104053 A1* | 8/2002 | Lei et al. | 714/752 |
| 2002/0116679 A1* | 8/2002 | Lei et al. | 714/785 |
| 2003/0192007 A1* | 10/2003 | Miller et al. | 714/782 |
| 2003/0229841 A1 | 12/2003 | Kravtchenko | |
| 2007/0245220 A1* | 10/2007 | Ito et al. | 714/782 |
| 2009/0217140 A1* | 8/2009 | Jo et al. | 714/785 |
| 2010/0251075 A1 | 9/2010 | Takahashi et al. | |
| 2013/0067300 A1* | 3/2013 | Matsuoka et al. | 714/807 |
| 2014/0040699 A1* | 2/2014 | Kuriyama | 714/758 |
| 2014/0075266 A1* | 3/2014 | Fujiwara et al. | 714/763 |
| 2014/0075267 A1* | 3/2014 | Koji | 714/764 |
| 2014/0089768 A1* | 3/2014 | Fujiwara et al. | 714/785 |

FOREIGN PATENT DOCUMENTS

JP    H06314979 A    11/1994
KR    10-0307583 B1    8/2001

* cited by examiner

Fig. 3

Table 1
Galois field GF($2^4$) when a primitive polynomial is $X^4+X+1$

| Square Representation | Vector Representation |
|---|---|
| 0 | 0000 |
| $1=\alpha^0$ | 0001 |
| $\alpha=\alpha^1$ | 0010 |
| $\alpha^2$ | 0100 |
| $\alpha^3$ | 1000 |
| $\alpha^4$ | 0011 |
| $\alpha^5$ | 0110 |
| $\alpha^6$ | 1100 |
| $\alpha^7$ | 1011 |
| $\alpha^8$ | 0101 |
| $\alpha^9$ | 1010 |
| $\alpha^{10}$ | 0111 |
| $\alpha^{11}$ | 1110 |
| $\alpha^{12}$ | 1111 |
| $\alpha^{13}$ | 1101 |
| $\alpha^{14}$ | 1001 |

$\alpha^4=1+\alpha$
$\alpha^5=\alpha(1+\alpha)=\alpha+\alpha^2$
$\alpha^6=\alpha(\alpha+\alpha^2)=\alpha^2+\alpha^3$
$\alpha^7=\alpha(\alpha^2+\alpha^3)=\alpha^3+\alpha^4=1+\alpha+\alpha^3$
$\alpha^8=\alpha(1+\alpha+\alpha^3)=\alpha+\alpha^2+\alpha^4=1+\alpha^2$
$\alpha^9=\alpha(1+\alpha^2)=\alpha+\alpha^3$ $\alpha^{10}=\alpha(\alpha+\alpha^3)=\alpha^2+\alpha^4=1+\alpha+\alpha^2$
$\alpha^{11}=\alpha(1+\alpha+\alpha^2)=\alpha+\alpha^2+\alpha^3$
$\alpha^{12}=\alpha(\alpha+\alpha^2+\alpha^3)=\alpha^2+\alpha^3+\alpha^4=1+\alpha+\alpha^2+\alpha^3$
$\alpha^{13}=\alpha(1+\alpha+\alpha^2+\alpha^3)=\alpha+\alpha^2+\alpha^3+\alpha^4=1+\alpha^2+\alpha^3$
$\alpha^{14}=\alpha(1+\alpha^2+\alpha^3)=\alpha+\alpha^3+\alpha^4=1+\alpha^3$
$\alpha^{15}=\alpha(1+\alpha^3)=\alpha+\alpha^4=1$

Fig. 4

Table 2
Galois field GF($2^3$) when a primitive polynomial is $x^3+x+1$

| Square Representation | Vector Representation | Basis Only Representation |
|---|---|---|
| 0 | 000 | 0 |
| $1=\alpha^0$ | 001 | 1 |
| $\alpha=\alpha^1$ | 010 | $\alpha$ |
| $\alpha^2$ | 100 | $\alpha^2$ |
| $\alpha^3$ | 011 | $\alpha+1$ |
| $\alpha^4$ | 110 | $\alpha^2+\alpha$ |
| $\alpha^5$ | 111 | $\alpha^2+\alpha+1$ |
| $\alpha^6$ | 101 | $\alpha^2+1$ |

$\boxed{e_4X^4 + e_2X^2 + e_1X} + e_3X^3 + e_0$
s(X)

Fig. 10

Table 3

|  | 1,3,4 bit (Correction) | | 2 bit (Correction) |
|---|---|---|---|
|  | $s_1 \neq 0$ | $s_1 = 0$ | — |
| $e_4$ | $s_1(s_3\beta + s_1\gamma)$ | $s_3^2$ | — |
| $e_3$ | $s_1^2(s_3\beta + s_1\gamma)$ | 0 | — |
| $e_2$ | $s_1(s_1\sigma + s_3\gamma)$ | $s_3 s_5$ | $s_1$ |
| $e_1$ | $s_1(s_3\beta + s_1\gamma) + s_1^2(s_1\sigma + s_3\gamma)$ | $s_3^3$ | $s_1^2$ |
| $e_0$ | $(s_1^2\beta + \gamma)(s_3\beta + s_1\gamma) + \beta(s_1\sigma + s_3\gamma)$ | $s_5 + s_3 s_7$ | $s_1^3 + s_3$ |

$\beta = s_1^3 + s_3$ $\gamma = s_1^5 + s_5$ $\sigma = s_1^7 + s_7$

Fig. 14

Matrix Operation converting vector $x=(x_3, x_2, x_1, x_0)$
into vector $y=(y_3, y_2, y_1, y_0)$ (Addition is XOR-Operation)

$$\begin{pmatrix} y_0 \\ y_1 \\ y_2 \\ y_3 \end{pmatrix} = \begin{pmatrix} 0 & 0 & 1 & 0 \\ 1 & 0 & 0 & 1 \\ 1 & 1 & 0 & 0 \\ 0 & 1 & 0 & 0 \end{pmatrix} \begin{pmatrix} x_0 \\ x_1 \\ x_2 \\ x_3 \end{pmatrix} \Leftrightarrow \begin{array}{l} y_0 = \phantom{x_0 +{}} x_2 \\ y_1 = x_0 \phantom{{}+ x_1} + x_3 \\ y_2 = x_0 + x_1 \\ y_3 = \phantom{x_0 +{}} x_1 \end{array}$$

ERROR CORRECTION CODE CIRCUIT AND MEMORY DEVICE INCLUDING THE SAME

CROSS-REFERENCE TO RELATED APPLICATION

Japanese Patent Application No. 2012-227834, filed on Oct. 15, 2012, in the Japanese Intellectual Property Office, and entitled: "Error Correction Code Circuit and Memory Device Including the Same," is incorporated by reference herein in its entirety.

BACKGROUND

1. Field

Embodiments relate to an error correction code circuit and a memory device including the same.

2. Description of the Related Art

A NAND flash memory is one of electrically erasable and programmable read only memories (EEPROMs). The NAND flash memory enables large amounts of data to be stored in a small chip area by using NAND cell units (NAND strings) in which a plurality of memory cells are serially connected.

In relation to a large capacity memory device such as the NAND flash memory, retained data disappear sometimes due to various causes. For example, due to degradation of a tunnel oxide layer according to several times of a rewrite operation, a memory cell loses data retaining characteristics while retaining data, and an error bit generation rate (error rate) tends to increase. In particular, in relation to the NAND flash memory, as a large capacity memory and a micronized manufacturing process are developed, the error rate tends to increase.

To handle this, an error correction code (ECC) circuit has been used to enhance performance of the NAND flash memory. Since this ECC circuit is mounted on-chip, a highly reliable memory may be provided.

SUMMARY

Embodiments provide error correction code (ECC) circuits including a Chien search unit configured to determine whether there is an error in each bit of a data sequence by using an arbitrary element on a Galois Field $GF(2^m)$, where m is an integer, as a substitution value of an error locator polynomial, wherein the Chien search unit, selects a coefficient of a nonlinear term from among terms of the error locator polynomial as a nonlinear coefficient; separates the error locator polynomial into a first location equation including only linear terms and a second location equation including only nonlinear terms; determines a third location equation by dividing the first location equation by the nonlinear coefficient; determines a fourth location equation by dividing the second location equation by the nonlinear coefficient; and determines whether there is an error for each of the bits by performing an XOR operation on a result of the third location equation using the substitution value and a result of the fourth location equation using the substitution value.

The Chien search unit may include a basis calculating unit configured to calculate linearly independent m elements from among $(2^m-1)$ elements when performing operations by substituting $(2^m-1)$ elements, which are represented as a vector with m bits on the Galois Field $GF(2^m)$, where m is an integer, for the third location equation; and a linear expansion unit configured to obtain $(2^m-1-m)$ elements except the m elements from among the $(2^m-1)$ elements as combinations of the m elements.

A number of XOR elements for performing the XOR operations may be less than $(n+1) \times (2^m-1) \times m(m-1)/2 + n \times (2^m-1) \times m$, where n is an order of the error locator polynomial, e.g., may be equal to n.

The fourth location equation may constant for each bit.

Embodiments may provide a memory device including an error correcting code (ECC) circuit, wherein the ECC circuit includes, a Chien search unit configured to determine whether there is an error in each bit of a data sequence by taking an arbitrary element of a Galois Field $GF(2^m)$, where m is an integer, as a substitution value of an error locator polynomial, and to output an error detection signal, a syndrome calculating unit configured to calculate syndromes from an input data sequence, an error coefficient calculating unit configured to calculate coefficients of an error locator polynomial from the syndromes, and an error correction unit configured to correct errors of data bits in the data sequence by using the error detection signal, and to output error corrected data bits. The Chien search unit may select a coefficient of a nonlinear term from among tennis of the error locator polynomial as a nonlinear coefficient, separate the error locator polynomial into a first location equation including only linear terms and a second location equation including only nonlinear terms, determine a third location equation by dividing the first location equation by the nonlinear coefficient, determine a fourth location equation by dividing the second location equation by the nonlinear coefficient, and determine whether there is an error for each of the bits by performing an XOR operation on a result of the third location equation using the substitution value and a result of the fourth location equation using the substitution value.

Embodiments may provide an error correction code (ECC) circuit including a search unit configured to determine whether there is an error in each bit of a data sequence by using an arbitrary element on a Galois Field $GF(2^m)$, where m is an integer, as a substitution value, wherein the search unit includes a basis calculating unit that generates basis vectors from elements that are linearly independent on the Galois Field $GF(2^m)$ based on an error locator polynomial that is a linear function using the substitution value; and a linear expansion unit that calculates remaining elements that are not linearly independent on the Galois Field by performing XOR operations on results output from the basis calculating unit using the substitution value, wherein a number of XOR elements in the linear expansion unit for performing the XOR operations is less than $(n+1) \times (2^m-1) \times m(m-1)/2 + n \times (2^m-1) \times m$, where n is an order of the error locator polynomial.

The number of XOR elements for performing the XOR operations may be equal to n.

BRIEF DESCRIPTION OF THE DRAWINGS

Features will become apparent to those of skill in the art by describing in detail exemplary embodiments with reference to the attached drawings in which:

FIG. 3 illustrates is a table of elements $1(=\alpha^0), \alpha^1, \alpha^2, \ldots \alpha^{14}$ of a Galois Field $GF(2^4)$ when a primitive polynomial $F(X)$ is $F(x)=X^4+X+1$;

FIG. 4 illustrates a table of elements $1(=\alpha^0), \alpha^1, \alpha^2, \ldots \alpha^6$ of a Galois Field $GF(2^3)$ when a primitive polynomial $F(X)$ is $F(x)=X^3+X+1$;

FIG. 5 illustrates an exemplary linear combination of an error locator polynomial;

FIG. 10 illustrates a table of coefficient values according to the number of correction bits;

FIG. 14 illustrates an exemplary matrix operation.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Figure 12:
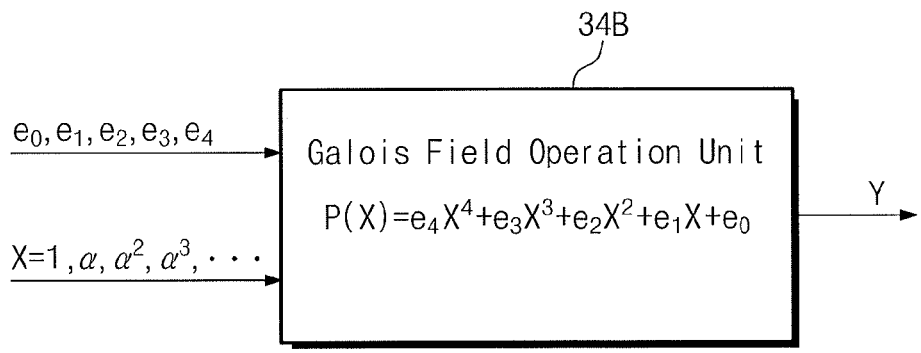
FIG. 12 illustrates an exemplary Galois Field operation circuit 34B.

In a typical Galois Field operation circuit, for example, in a circuit (a circuit for 4$^{th}$ order polynomial) shown in FIG. 12, after coefficients (e0, e1, e2, e3, e4) of an error locator polynomial P(X), roots of P(X) are obtained by sequentially inputting $1(=\alpha^0)$, $\alpha(=\alpha^1)$, $\alpha^2$, $\alpha^3$, ..., as a Galois field element X. In detail, in a Galois Field operation circuit 34B for obtaining roots of a typical Galois Field polynomial, firstly, coefficients $e_i$(i=0, 1, 2, 3, 4) are calculated; secondly, a term $e_iX^i$ is calculated; and, thirdly, each term corresponding to i=0, 1, 2, 3, 4 is summed. Then, the above-described first to third processes are performed on all available or a portion of X(1, $\alpha$, $\alpha^2$, $\alpha^3$, ..., ,) and the roots of the polynomial P(X) are obtained. However, in this method, it may take a very long time to obtain roots, because elements (1, $\alpha$, $\alpha^2$, $\alpha^3$, ..., ,) of a Galois Field are sequentially input to obtain roots of P(X).

Figure 13:
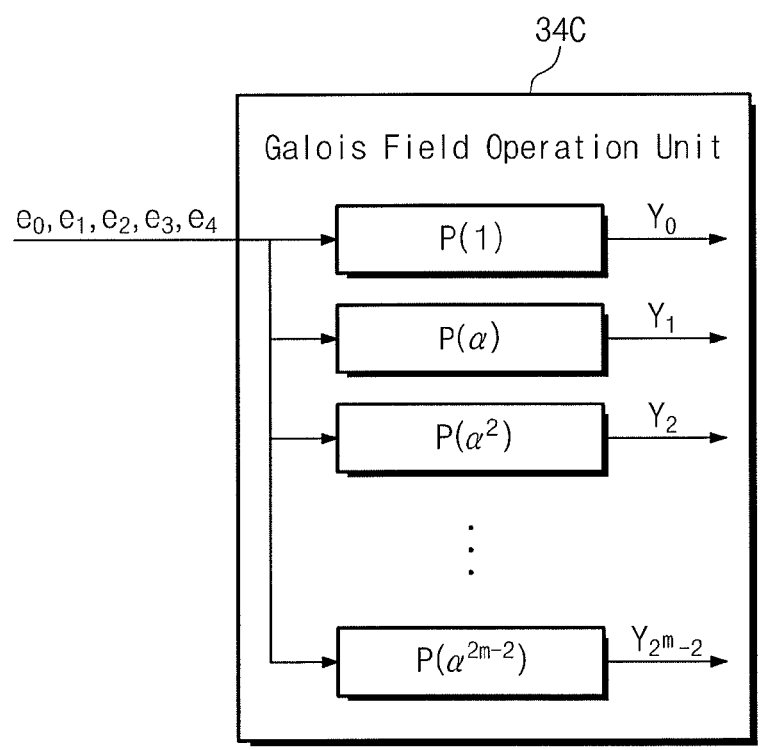
FIG. 13 illustrates an exemplary Galois Field operation circuit 34C.

To handle this, a circuit (an example of 4-th order polynomial) for obtaining roots of the polynomial P(X) at once may be used. For example, a Galois Field operation circuit 34C, as shown in FIG. 13, prepares a parallel operation circuit for each element 1, $\alpha$, $\alpha^2$, $\alpha^3$, ..., $\alpha^{t-2}$, where t=2$^m$, and simultaneously operates P(1), P($\alpha$), P($\alpha^2$), P($\alpha^3$), ... P($\alpha^{t-2}$), so that operation time for an error locator polynomial may be greatly reduced. However, in the method shown in FIG. 13, since P(X) for all available X is obtained at once, it takes little time to obtain roots, but a circuit size may become very large.

In the circuit shown in FIG. 13, a portion corresponding to each term in each unit performs a linear operation which multiplies integers, so that it may be represented as a matrix operation. FIG. 14 illustrates an exemplary matrix operation. For example, referring to the exemplary matrix operation shown in FIG. 14, a matrix used in an operation converts an element X of a Galois Field, which is considered as a vector, into another vector. In addition, when a Galois Field GF(2$^m$) is employed, where m corresponds to the number of bits of a binary data when a Galois Field element X is represented as a vector, a circuit corresponding to a matrix operation may be configured with about m(m−1)/2 XOR elements. When an order of the polynomial is n, this matrix operation outputs a result of adding m bits as many as the number of (n+1) terms. Therefore, this requires m×n XOR elements.

When a range of available X is an entire Galois Field, the number of units in FIG. 13 is $2^m-1$ and totally becomes $(n+1)\times(2^m-1)\times m(m-1)/2+n\times(2^m-1)\times m$.

For example, in case where m=8 and n=4, a total of about 43,800 XOR elements is required. Thus, even when an operation for each term is replaced with a matrix operation instead of multiplying two inputs, the circuit size may become very large.

In a Galois Field operation circuit according to embodiments, as described in detail below, for example, an error locator polynomial $P(X)=e_4X^4+e_3X^3+e_2X^2+e_1X+e_0$ may be divided by a coefficient $e_3$ of a nonlinear term $X^3$ and a new error locator polynomial $P'(X)=e_4/e_3X^4+X^3+e_2/e_3X^2+e_1/e_3X+e_0/e_3$ may be obtained. Accordingly, $X^3$ becomes a fixed value for each bit, and $e_0'=e_0/e_3$ may be an integer.

Also, from the new error locator polynomial P'(X), a linear function may be generated as $s'(X)=(e_4/e_3)X^4+(e_2/e_3)X^2+(e_1/e_3)X$ by combining linear terms of X in P'(X).

To calculate the linear function s'(X), first the linear function s'(X) of basis vectors, which are linearly independent from each other on a Galois Field, is calculated. Then, to calculate the linear function s'(X) for ($2^m-1-m$) elements other than the basis vectors, the linear function s'(X) of the basis vectors are expanded. Thus, a calculating circuit for the linear function s'(X) may be simplified.

Thus, since a calculating circuit of the linear function s'(X) becomes simplified and $X^3$ becomes a fixed value, a circuit for operating an error locator polynomial may be simplified and a circuit size thereof may be reduced.

Therefore, an error correction code (ECC) circuit for obtaining roots of an error locator polynomial in high speed may be realized in a size that allows the ECC circuit may be embedded in a semiconductor memory.

Configuration of a Memory Device

Figure 1:
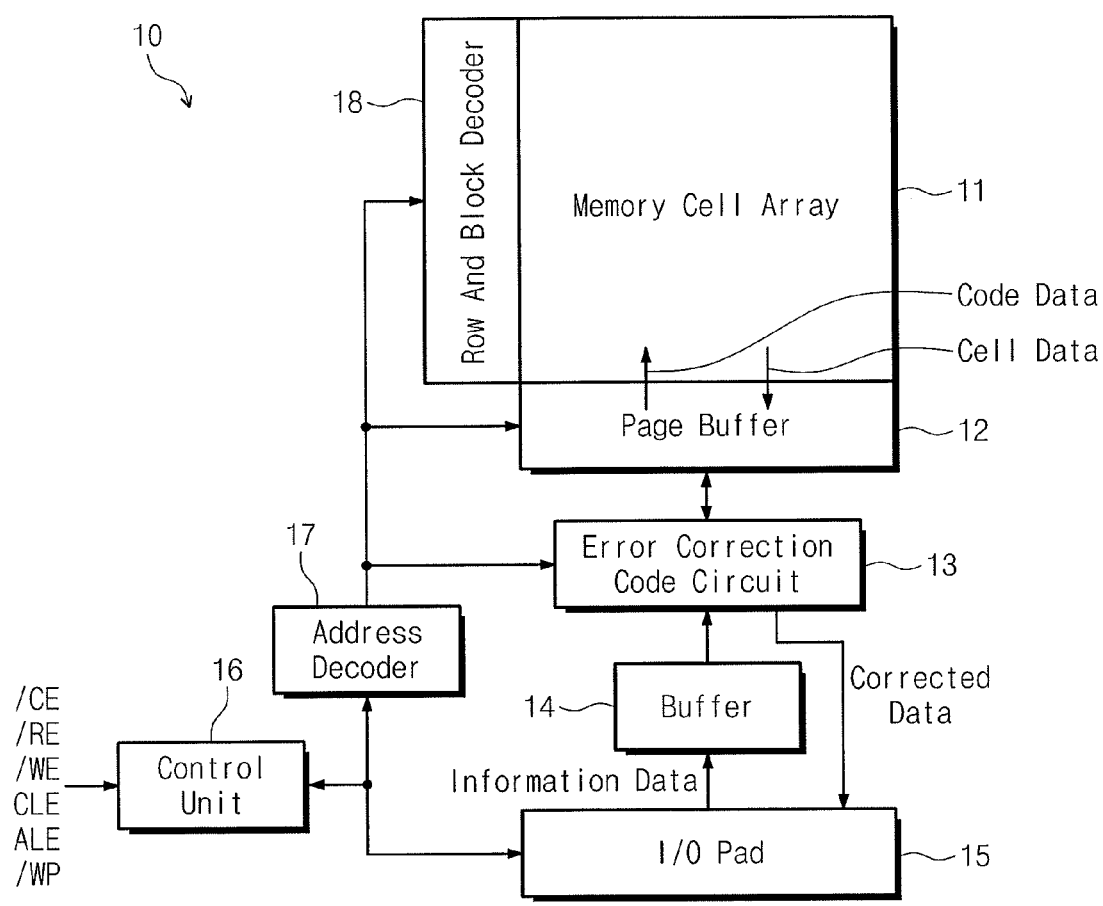
FIG. 1 illustrates a memory device according to an embodiment.

FIG. 1 illustrates a memory device according to an embodiment, illustrating a NAND flash memory which is a nonvolatile semiconductor memory device 10. The nonvolatile semiconductor memory device 10 may include a memory cell array 11, a page buffer 12, an ECC circuit 13, a buffer 14, an I/O pad 15, a control circuit 16, an address decoder 17, and a row and block decoder 18.

Although, the configuration of the nonvolatile semiconductor memory device 10 is that of a typical NAND flash memory, the present embodiment includes a Galois Field operation circuit 34 (an operation circuit for an error locator polynomial) in a Chien search unit 33 (FIG. 2) included in the ECC circuit 13.

Hereinafter, an entire configuration of the nonvolatile semiconductor memory device 10 is described. In the nonvolatile semiconductor memory device 10, the memory cell array 11 may include a plurality of stack-gate structured transistors, namely, a block in which a plurality of NAND cell strings, which have electrically erasable and programmable nonvolatile memory cells (memory elements) serially connected in a column direction and are prepared for each bit line, are disposed in a row direction (an arrayed direction of the bit lines). This block may be disposed in plural in an interconnection direction of the bit lines. Also, data in the memory cells may be erased for each block unit. For each block, word lines orthogonal to the bit lines may be connected to each gate of the nonvolatile memories disposed in an identical row.

A range of nonvolatile memory cells selected by one word line is one page which is a unit of program and reading.

The page buffer 12 may be configured with a page buffer circuit prepared for each bit line in order to perform data programming and reading for each page unit. In this page buffer 12, each of the page buffer circuits may include a latch circuit which is connected to each bit line and used as a sense amplifying circuit for amplifying and determining a potential of the connected bit line.

In relation to data read operation from the nonvolatile semiconductor memory device 10, the page buffer 12 may receive an input of cell data which is formed of data (data bit sequence) retained by one page memory cells of the memory cell array 11, amplify the received data and output the amplified data to the ECC circuit 13. Furthermore, for a data write (programming) operation to the nonvolatile semiconductor memory device 10, the page buffer 12 may store data provided from the ECC circuit 13 in an internal latch circuit, perform a verifying operation, and write all data to memory cells in one page as code data.

The code data may include parity data created by the ECC circuit 13.

For example, when an ECC system assumes that an error locator polynomial P(X) is $P(X)=e_4X^4+e_3X^3+e_2X^2+e_1X+e_0$ and 4 bit error correction is performed by using a Bose-Chaudhuri-Hocquenghem (BCH) code for 300 bit long data, a 36-bit parity may be used. Also, X is a 9-bit mark value allocated to every 300 bits.

In a data read operation from the nonvolatile semiconductor memory device 10, the ECC circuit 13 may process the read data for each sector to calculate coefficients of the error locator polynomial and latch the calculated coefficients to retain them. Also, for the read operation, the ECC circuit 13 may correct errors of data bits, locations of which are marked with column addresses, and output the corrected data to the outside through the I/O pad 15.

In a data write operation to the nonvolatile semiconductor memory device 10, the ECC circuit 13 may receive information data input from the I/O pad 15 through the buffer 14. The ECC circuit 13 may create parity data from the received information data and, at the same time, output the received information data and the parity data to the page buffer 12. The page buffer 12 may write these data to memory cells connected to a selected page as code data.

The control circuit 16 may receive various control signals to control data programming, read and erase operations, and a verifying operation for the nonvolatile memory cells For example, the control signal may include an external clock signal, a chip enable signal (/CE), read enable signal (/RE), a program enable signal (/WE), a command latch enable signal (CLE), an address latch enable signal (ALE), and a write protection signal (/WP), etc. The control signal 16 may output an internal control signal for each circuit according to the control signal and an operation mode which is represented by that command data input from the I/O pad 15.

For example, the control circuit 16 may receive command data from the I/O pad 15 to retain the data in an internal register by allowing the command latch enable signal (CLE) to transit from a low level (L) to a high level (H) when the program enable signal (/WE) rises.

The address decoder 17 may retain addresses (row addresses, block addresses, and column addresses) input from the I/O pad 15 on the basis of internal control signals from the control circuit 16. Furthermore, the address decoder 17 may output the retained addresses to the row and block decoder 18, the page buffer 12, and the ECC circuit 13 on the basis of internal control signals from the control circuit 16.

For example, the control circuit 16 may receive addresses from the I/O pad 15 and retain them in an internal register of the address decoder 17 by allowing the address latch enable signal ALE to transit from a low level (L) to a high level (H) when the program enable signal (/WE) rises.

The row and block decoder 18 may select block and word lines of the memory cell array 11 according to row addresses and block addresses that the address decoder 17 retains and outputs, and select one page memory cells. Also, the address decoder 17 may select bit lines of the memory cell array 11 and the page buffer 12 according to column addresses internally retained therein.

In a data read operation from the nonvolatile memory device 10, the ECC circuit 13 processes the read data for each sector and calculates coefficients of the error locator polynomial. Also, for the read operation, the ECC circuit 13 corrects errors of data for each bit whose location is marked with the column address, and output the corrected data to the outside through the I/O pad 15.

In relation to a data write operation to the nonvolatile semiconductor memory device 10, the ECC circuit 13 may receive information data input from the I/O pad 15 through the buffer 14. The ECC circuit 13 may create parity data from the received information data and, at the same time, output the received information data and the parity data to the page buffer 12. The page buffer 12 may write these data to memory cells connected to a selected page as code data.

Figure 2:
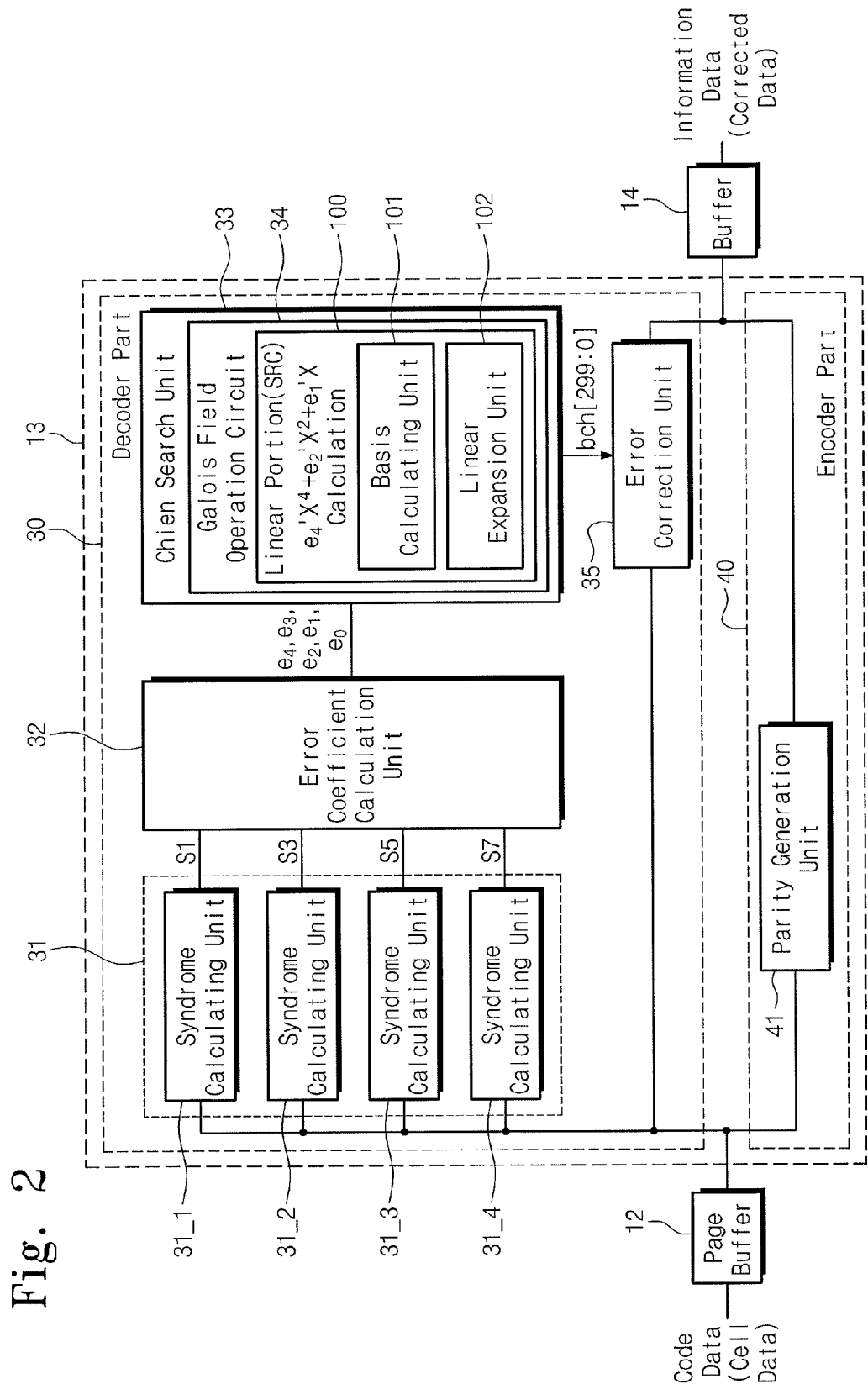
FIG. 2 illustrates an exemplary error correction code (ECC) circuit in the NAND flash memory of FIG. 1.

FIG. 2 illustrates an exemplary ECC circuit 13 of the NAND flash memory of FIG. 1. The example shown in FIG. 2 is an ECC circuit 13 using a BCH code. The BCH code is a block code using a Galois Field operation. Alternative codes, e.g., a Hamming code or a RS code, may be used instead of the BCH code.

The ECC circuit 13 may include a decoder unit 30 decoding data and an encoder unit 40 generating parity data for correction, and adding the parity data for correction to the write data to the memory cells.

The encoder unit 40 may include a parity generating circuit 41. The parity generating circuit 41 may generate parity data by dividing information data written to the buffer 14 by a generator polynomial. Also, the parity generating circuit 41 may add the generated parity data to the information data and output the added result to the page buffer 12. These data may be code data written to one page selected in the data write operation to the nonvolatile semiconductor memory device 10.

Furthermore, according to an embodiment, in the data read operation from the nonvolatile memory device 10, the ECC circuit 13 may perform a data correction code process in high speed, and, at the same time, reduce a circuit size of a Chien search unit 33 (or of a Galois Field operation circuit 34 included therein) included in the ECC circuit 13. Hereinafter, the decoder unit 30 is described in detail.

The decoder 30 may include a syndrome calculating unit 31, a error coefficient calculating unit 32, the Chien search unit 33, and an error correction unit 35. The Chien search unit 33 may include the Galois field operating circuit 34.

In the data read operation from the nonvolatile semiconductor memory device 10, the read data is input to the page buffer 12 as code data. Then, the syndrome calculating unit 31 may calculate syndromes by dividing the code data by an independent minimum polynomial. Independent minimum polynomials may be four which are used as a BCH code in which errors in four bit data are correctable. The syndrome calculating unit 31 may include four syndrome calculating circuits 31_1 to 314 corresponding to the four minimum polynomials. The syndrome calculating circuits 31_1 to 31_4 may respectively calculate syndromes S1, S3, S5, and S7.

The error coefficient calculating unit 32 may use the syndromes S1, S3, S5, and S7, and calculate coefficients of an error locator polynomial. For example, when the error locator polynomial is a $4^{th}$ order polynomial $P(X)=e_4X^4+e_3X^3+e_2X^2+e_1X+e_0$, the error coefficient calculating unit 32 may calculate coefficients $e_4$, $e_3$, $e_2$, $e_1$, and $e_0$. In addition, the Chien search unit 33 may calculate the error locator polynomial P(X) by using the Galois field operation circuit 34. Code data, namely, values (for example, 9-bit mark values) representing bit positions (for example, bit line positions) of cell data stored in the page buffer 12 may be input to a variable X of the error locator polynomial P(X). That is, the error locator polynomial P(X) may be used in the Chien search unit 33 to determine whether bits read from the page buffer 12 have errors.

The Chien search unit 33 calculates the error locator polynomial $P(X)=e_4X^4+e_3X^3+e_2X^2+e_1X+e_0$ for each bit of 300 bit data by using the Galois Field operation circuit 34, generates an error detection signal bch[299:0] corresponding to each bit, and outputs the error detection signal bch[299:0] to the error correction unit 35. For example, when a value of P(X) is 0, the Chien search unit 33 may output the detection signal bch as an H level. In contrast, when a value of P(X) is not 0, the Chien search unit 33 may output the detection signal bch as an L level.

For example, when the error detection signal bch is the H level, the error correction unit 35 may invert a logic (0 or 1) of bit data of a corresponding position and output as one bit of corrected data. In contrast, when the error detection signal bch is the L level, the error correction unit 35 may output one bit of corrected data without inverting a logic of the bit data of the corresponding position.

In the ECC circuit 13 having the above-described configuration, as described below, the Galois Field operation circuit 34 may reduce a size of an operation circuit of an error locator polynomial by dividing the error locator polynomial P(X) by a coefficient ($e_3$) of a nonlinear term (for example, $e_3X^3$), and, at the same time, separately perform the division operation of the error locator polynomial on linear terms and nonlinear terms.

Hereinafter, linearity of a Galois Field and a polynomial is described. Also, in description about the linearity below, for ease of illustration and explanation, a case is exemplified where m=3 (or m=4) and an order of an error locator polynomial is 4 (n=4) in a Galois Field $G(2^m)$. However, the order m and n may be set as arbitrary values according to a bit length and the number of error correcting bits of error detecting target data.

Linearity in the Polynomial and a Linear Structure in the Galois Field

When a certain function F(X) satisfies two conditions below, F(X) is referred to be linear for X:

$$F(X_1+X_2)=F(X_1)+F(X_2) \quad \text{(condition 1)}$$

$$F(a \cdot X_1)=a \cdot F(x_1) \quad \text{(condition 2)}$$

For example, when X is an element of the Galois Field, $F(X)=X^2$ is a linear function of X, because, when $X_1$ and $X_2$ are elements of the Galois Field, and a=0 or 1, $$\begin{aligned} F(X_1+X_2) &= (X_1+X_2)^2 \\ &= X_1^2 + 2X_1 \cdot X_2 + X_2^2 \\ &= X_1^2 + X_2^2 \; (\because \text{an addition on the Galois Field is an} \\ &\quad \text{exclusive OR, and } 1+1=2=0) \\ &= F(X_1) + F(X_2), \end{aligned}$$

Thus, (condition 1) is satisfied. Also, since a is 0 or 1, (condition 2) is also satisfied. Likewise, since 1+1=0 on the Galois Field, a function of multiplying X by X by powers of 2, e.g., $X^4, X^8, X^{16}, \ldots$, etc., is a linear function on the Galois Field.

A sum of first, second, and fourth terms of a Galois Field polynomial is $Q(X)=e_4X^4+e_2X^2+e_1X$. Assuming X and Y are elements of the Galois Field, $$\begin{aligned} Q(X+Y) &= e_4(X+Y)^4 + e_2(X+Y)^2 + e_1(X+Y) \\ &= e_4(X^4+Y^4) + e_2(X^2+Y^2) + e_1(X+Y) \\ &\quad (\because 2=4=0 \text{ on the Galois Field}) \\ &= e_4X^4 + e_4Y^4 + e_2X^2 + e_2Y^2 + e_1X + e_1Y \\ &= (e_4X^4 + e_2X^2 + e_1X) + (e_4Y^4 + e_2Y^2 + e_1Y) \\ &= Q(X) + Q(Y), \end{aligned}$$

Thus, (condition 1) is satisfied. Also, obviously (condition 2) is satisfied. Thus, $Q(X)=e_4X^4+e_2X^2+e_1X$ is a linear function of X.

Furthermore, for other terms (terms besides $X^4$, $X^2$, and X), for example, by considering $X^3$ or $X^5$ as variables, it is possible to consider Q(X) as a linear function. For example, for a 3rd order, a 6th order, and a 12th order terms, let $R(X)=e_{12}X^{12}+e_6X^6+e_3X^3$. Then, R(X) is a linear function of $X^3$.

A linear structure in the Galois Field is described.

FIG. 3 illustrates a table (Table 1) illustrating elements $1(=\alpha^0), \alpha^1, \alpha^2, \ldots, \alpha^4$ of a Galois Field $GF(2^4)$, when a primitive polynomial $F(X)=X^4+X+1$. Here, for 4 elements (a portion enclosed with a dotted line) of 1, a, $\alpha^2$, and $\alpha^3$, it may be shown that these are linearly independent pairs that each element is not represented by sum of other elements except each element itself. Let these be basis vectors, then other elements may be represented with a linear combination of the basis vectors. That is, by using a relationship, $\alpha^4+\alpha^1+\alpha=0$, each element $1(=\alpha^0), \alpha^1, \alpha^2, \alpha^{14}$ may be represented with 4-dimensional vectors (0, 0, 0, 0) to (1, 1, 1, 1) which have $\alpha^0$, $\alpha, \alpha^2$, and $\alpha^3$ as elements. For example, $\alpha^4$ and $\alpha^{12}$ may be respectively represented as $\alpha^4=1+\alpha^1$ and $\alpha^{12}=\alpha^2(\alpha^1+\alpha^2+\alpha^3)=\alpha^2+\alpha^3+\alpha^4=1+\alpha^1+\alpha^2+\alpha^3$.

Also, it is assumed $\beta_i=0, 1$ (i=0, 1, 2, 3), an arbitrary Galois Field element may be represented as $\alpha^j=\beta_3\alpha^3+\beta_2\alpha^2\beta_1\alpha^1+\beta_0a^0$, where j=0, 1, 2, .... Here, ($\beta_3, \beta_2, \beta_1, \beta_0$) is a vector representation corresponding to $\alpha^j$.

Let the above-described Q(X) be represented as $Q_j=Q(\alpha^j)$, where j=0, 1, 2, .... When Q(X) is substituted by $\alpha^j=\beta_3\alpha^3+\beta_2\alpha^2+\beta_1\alpha^1+\beta_0\alpha^0$ $$\begin{aligned} Q_j &= Q(\alpha^j) \quad &\text{Equation 1} \\ &= Q(\beta_3\alpha^3 + \beta_2\alpha^2 + \beta_1\alpha^1 + \beta_0\alpha^0) \\ &\quad \beta_3 Q(\alpha^3) + \beta_2 Q(\alpha^2) + \beta_1 Q(\alpha^1) + \beta_0 Q(\alpha^0) \\ &\quad (\because \text{due to of linearity of } Q(X)) \\ &= \beta_3 Q_3 + \beta_2 Q_2 + \beta_1 Q_1 + \beta_0 Q_0 \quad &\text{Equation 2} \end{aligned}$$

Although, typically, from Equation 1, $Q_j=e_4\alpha^4+e_2\alpha^2+e_1\alpha$ and a matrix operation result is added to each term, in the present embodiment, other $Q_j$ may be obtained by using Equation 2, obtaining in advance $Q_0, Q_1, Q_2$, and $Q_3$, corresponding to basis $1(=\alpha^0), \alpha^1, \alpha^2, \alpha^3$ by a matrix operation, and simply adding them.

FIG. 4 illustrates a table (Table 2) illustrating elements $1(=\alpha^0)$, $\alpha^1$, $\alpha^2$, $\alpha^3$ of Galois Field $GF(2^3)$ when a primitive polynomial $F(X)$ is $F(X)=X^3+X+1$. Here, for 3 elements (a portion enclosed with a dotted line) of 1, $\alpha$, and $\alpha^2$, it can be shown that these are linearly independent pairs that each element is not represented by sum of other elements except each element itself. That is, by using a relationship, $\alpha^3+\alpha^1+a^0=0$, each element 0, $\alpha^0(=1)$, $\alpha^1$, $\alpha^2$, ..., $\alpha^6$ may be represented with 3-dimensional vectors $(0, 0, 0)$ to $(1, 1, 1)$ which have $\alpha^0$, $\alpha$, and $\alpha^2$ as elements.

Example of Using Linearity of an Error Locator Polynomial

As described above, for an error locator polynomial, for example, let $s(X)=e_4X^4+e_2X^2+e_1X$. Then, the polynomial $s(X)$ becomes a linear function of X. Calculation of the linear function $s(X)$ may be simplified by using the above-described polynomial and linearity of the Galois Field. Here, an example of simplifying an operation of the linear function $s(X)$. For easy of illustration and explanation, a Galois Field $GF(2^3)$ and operation of combining linear terms are exemplified. However, the description may be also applied to an arbitrary m-th order Galois Field $GF(2^m)$.

FIG. 5 illustrates an exemplary linear combination of an error locator polynomial. As shown in FIG. 5(A), when an error locator polynomial is 4-th order error locator polynomial $P(X)=e_4X^4+e_3X^3+e_2X^2+e_1X+e_0$, as shown in FIG. 5(B), an example is described that a linear function $s(X)=e_4X^4+e_2X^2+e_1X$ is generated, which combines linear terms of the error locator polynomial $P(X)$, and an operation is performed on the linear function $s(X)$.

Figure 6:
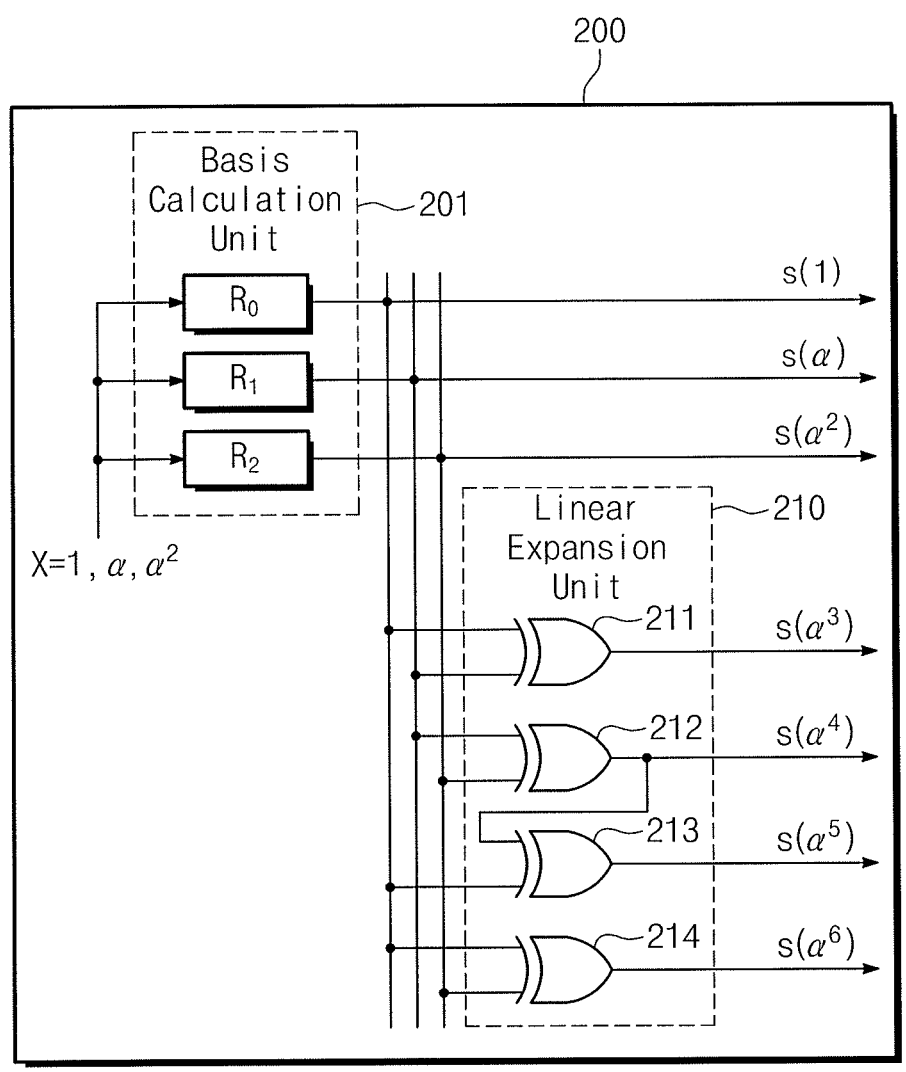
FIG. 6 illustrates an exemplary operation circuit for a linear function s(X)

FIG. 6 illustrates an exemplary operation circuit 200 for the linear function $s(X)$. The operation circuit 200 includes a basis calculating unit 201 and a linear expansion unit 210.

The basis calculating unit 201 includes three operation units $R_1$ to $R_3$. Operation unit $R_1$ calculates a linear function $s(1)=e_4 1^4+e_2 1^2+e_1 1$ in an error locator polynomial by a matrix operation. Operation unit $R_1$ calculates a linear function $s(\alpha)=e_4\alpha^4+e_2\alpha^2+e_1\alpha$ for an element $X(=\alpha^1=\alpha)$. Operation unit $R_2$ calculates a linear function $s(\alpha^2)=e_4(\alpha^2)^4+e_2(\alpha^2)^2+e_1(\alpha^2)$ for an element $X(=\alpha^2)$.

The linear expansion unit 210 may obtain another output by simply adding and expanding operation results $s(1)$, $s(\alpha)$, and $s(\alpha^2)$ output from the basis calculating unit 201. The linear expansion unit 210 may include four XOR elements 211 to 214 serving as adders.

For example, $s(\alpha^3)$ may be represented as $S(\alpha^3)=s(\alpha)+s(1)$ due to the above-described linearity, since $\alpha^3=\alpha+1$, as shown in Table 2 of the Galois Fled $GF(2^3)$ of FIG. 4. Therefore, $s(\alpha^3)$ may be obtained by adding $s(1)$ and $s(\alpha)$ output from the basis calculating unit 201 using XOR element 211.

For example, $s(\alpha^4)$ may be represented as $S(\alpha^4)=s(\alpha^2)+s(\alpha)$ due to the above-described linearity, since $\alpha^4=\alpha^2+\alpha$, as shown in Table 2 of Galois Fled $GF(2^3)$ of FIG. 4. Therefore, $s(\alpha^4)$ may be obtained by adding $s(\alpha)$ and $s(\alpha^2)$ which are output from the basis calculating unit 201 using XOR element 212.

For $s(\alpha^5)$, $\alpha^5=\alpha^4+1$, since $\alpha^5=\alpha^2+\alpha+1$ and $\alpha^4=\alpha^2+\alpha$. Therefore, $s(\alpha^5)$ may be obtained by adding $s(1)$ output from the basis calculating unit 201 and $s(\alpha^4)$ output from XOR element 212 using XOR element 213.

For $s(\alpha^6)$, since $\alpha^6=\alpha^2+1$, $s(\alpha^6)$ may be obtained by adding $s(1)$ and $s(\alpha^2)$ output from the basis calculating unit 201 using XOR element 214.

Thus, for Galois Field $GF(2^3)$, the basis calculating unit 201 may calculate three linear functions $s(1)$, $s(\alpha^1)$, and $s(\alpha^2)$ corresponding to three linearly independent elements $(1, \alpha, \alpha^2)$. The linear expansion unit 210 may calculate linear functions $s(\alpha^3)$, $s(\alpha^4)$, $s(\alpha^5)$, $s(\alpha^6)$ using ng XOR elements on the basis of $s(1)$, $s(\alpha^1)$, and $s(\alpha^2)$ output from the basis calculating unit 201. Thus, in the operation circuit 200, a circuit size may be reduced by permutating a matrix operation with simple addition for '4' error locator polynomials (more accurately, for the linear function $s(X)$), where the '4' is output by subtracting the number of three basis vectors from a total of seven for all non-zero values available for an element X.

In an exemplary circuit shown in FIG. 6, as three linearly independent basis pairs, bases of vector representation (001), (010), and (100) are used as shown in Table 2 of FIG. 4. However, it is not necessary to select vectors having one bit of '1' as basis vectors, and any combination is acceptable with linearly independent vector pairs.

Like this, the operation circuit 200 may combine terms forming an identical linear space in an error locator polynomial as the linear function $s(X)$, and perform an operation by using the basis calculating unit 201 and the linear expansion unit 210 for the combined linear function. Accordingly, a size of an operation element for operating the error locator polynomial may be reduced in the operation circuit 200.

Figure 7:
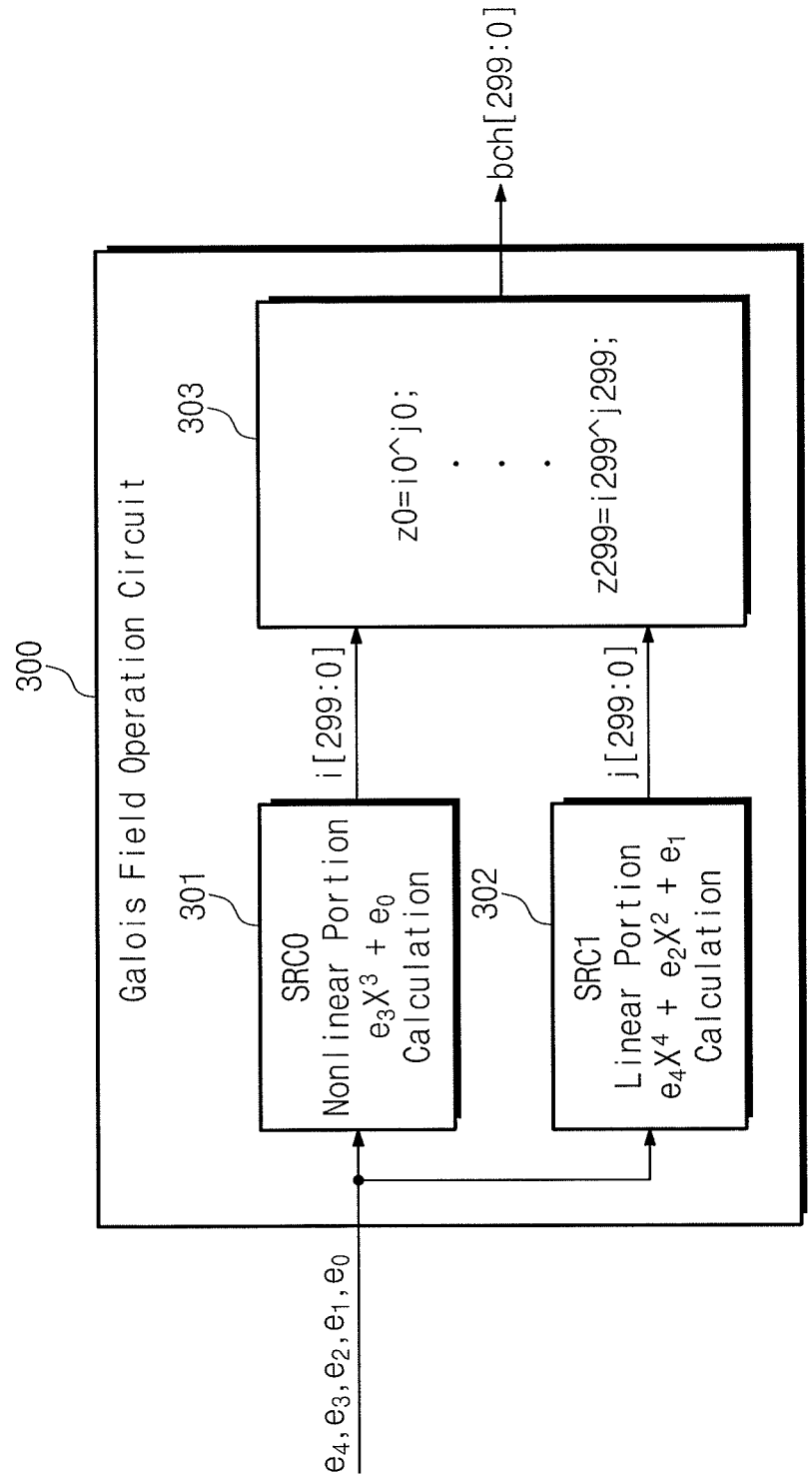
FIG. 7 illustrates an exemplary circuit for operating an error locator polynomial by using a Galois Field operation circuit 300 for 300-bit long data.

FIG. 7 illustrates an exemplary circuit for operating an error locator polynomial by using a Galois Field operation circuit 300 for 300 bit long data.

The Galois Field operation circuit 300 represents an example of combining linear terms in the error locator polynomial. The Galois Field operation circuit 34 used in the ECC circuit 13 of the present embodiment, as described below, may further perform a process for dividing the error locator polynomial by a coefficient of a nonlinear term. That is, the ECC circuit 13 of the present embodiment may use the Galois Field operation circuit 300 shown in FIG. 7 having an improved configuration as the Galois Field operation circuit 34.

In the circuit 300 shown in FIG. 7, a nonlinear portion operation circuit (SRC0) 301 may operate $e_3X^3+e_0$, and output an operation result i[299:0] for each bit. In addition, a linear portion operation circuit (SRC1) 302 may operate the linear function $s(X)=e_4X^4+e_2X^2+e_1X$ and output an operation result j[299:0] for each bit. In addition, an adding circuit 303 performs addition $(z0=i0\hat{\ }j0, \ldots, z299=i299\hat{\ }j299)$ of the operation results for each bit and output an operation result bch[299:0] for each bit. In the present embodiment, '^' indicates an XOR operation.

In the linear portion operation circuit 302, when a linear function $s(X)=e_4X^4+e_2X^2+e_1X$ operates like the circuit shown in FIG. 6, a size (the number of operation elements) of a circuit for operating the linear function $s(X)$ may be reduced by performing an operation for the linear function $s(X)$ by using a basis calculating unit and a linear expansion unit.

Example of Dividing an Error Locator Polynomial by a Coefficient of a Nonlinear Term As described above, although a circuit size may be reduced by combining linear terms of an error locator polynomial in a Galois Field operation circuit, an ECC circuit according to the present embodiment may further reduce the circuit size. That is, the circuit size may be further reduced by dividing an error locator polynomial (for example, $P(X)=e_4X^4+e_3X^3+e_2X^2+e_1X+e_0$) by a coefficient of a nonlinear term (for example, a coefficient $e_3$ of $e_3X^3$) to generate a new error locator polynomial, and combining and operating linear terms in the new error locator polynomial.

Hereinafter, an example of dividing an error locator polynomial by a nonlinear term coefficient in Galois Field $GF(2^3)$ is described. When the error locator polynomial $P(X)$ is divided by the nonlinear term coefficient $e_3$, an error equation becomes:

$$P'(X) = s'(X) + X^3 + e_0',$$

Here, $s'(X) = (e_4/e_3)X^4 + (e_2/e_3)X^2 + (e_1/e_3)X,$ $$= (e_4')X4 + (e_2')X2 + (e_1')X, \text{ where } e_4' = e_4/e_3, e_2' = e_2/e_3, e_1' = e_1/e_3, \text{ and } e_0' = e_0/e_3.$$

Accordingly, a term $X^3$ may become a fixed value while linear terms of $P'(X)$ are combined to $s'(X)$ and then calculated. In addition, since $e_0'$ is an integer, an operation for the error locator polynomial may be performed by one circuit. Therefore, a circuit size of the Galois Field operating circuit may be further reduced.

Figure 8:
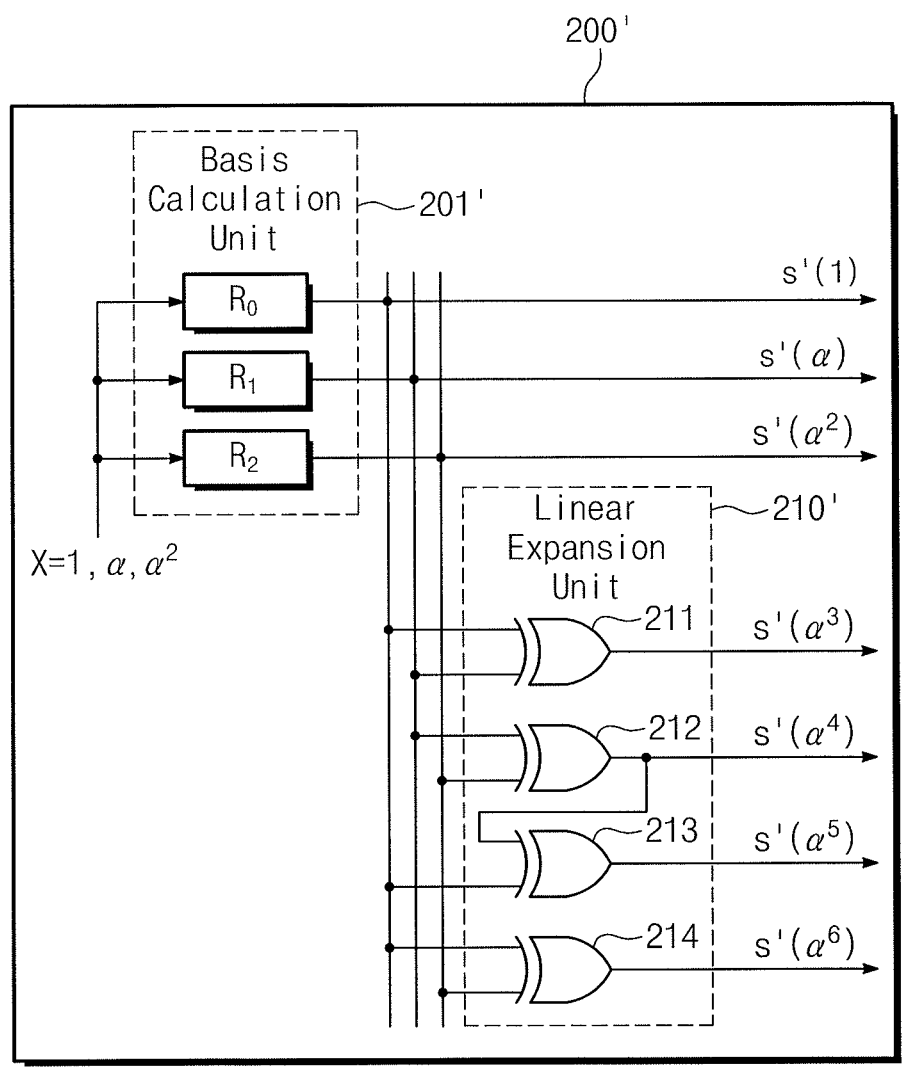
FIG. 8 illustrates an exemplary operation circuit of a linear function s'(X)

FIG. 8 illustrates an exemplary operation circuit 200' of a linear function $s'(X)$, which is the same circuit as that shown in FIG. 6, but operating on a different error locator polynomial. The operation circuit 200' may include a basis calculating unit 201' and a linear expansion unit 210'.

The operation circuit 200' may include three operation units $R_0$ to $R_3$. Operation unit $R_0$ may calculate a linear function $s'(1=\alpha^0) = e_4'1^4 + e_2'1^2 + e_1'1$ in an error locator polynomial for an element X ($1=\alpha^0$) by using a matrix operation. Operation unit $R_1$ may calculate a linear function $s'(\alpha) = e_4'\alpha^4 + e_2'\alpha^2 = +e_1'\alpha$ in an error locator polynomial for an element X ($=\alpha=\alpha^1$) by using a matrix operation. Operation unit $R_2$ may calculate a linear function $s'(\alpha^2) = e_4'(\alpha^2)^4 + e_2'(\alpha^2)^2 + e_1'(\alpha^2)$ in an error locator polynomial for an element X ($=\alpha^2$) by using a matrix operation.

The linear expansion unit 210' may expand $s'(1)$, $s'(\alpha)$, $s'(\alpha^2)$ calculated by the basis calculating unit 201' with simple addition through XOR elements 211 to 214 and obtain other outputs.

Thus, in the operation circuit 200' shown in FIG. 8, a new error locator polynomial $P'(X)$ is generated by dividing an error locator polynomial $P(X)$ by a coefficient (for example, $e_3$ of $e_3X^3$) of a nonlinear term, and an $X^3$ term may be set as a fixed value. Also, in the operation circuit 200', a linear function $s'(X)$ is generated by combining linear terms of the new error locator polynomial $P'(X)$ and the linear function $s'(X)$ may be operated by using the basis calculating unit 201' and the linear expansion unit 210'. Therefore, a circuit size of the Galois Field operating circuit may be further reduced.

In the above, examples and effects are described in case where an error locator polynomial is operated by dividing the error locator polynomial by a nonlinear term coefficient (for example, $e_3$ of $e_3X^3$), generating a new error locator polynomial, combining linear terms of the new error locator polynomial, and operating the combined linear terms.

The ECC circuit 12 in the present embodiment may include the Chien search unit 33 (more accurately the Galois Field operation circuit 34) having a function of dividing the above error locator polynomial by a nonlinear term coefficient, and a function of combining and operating linear terms of the error locator polynomial. Hereinafter, an exemplary configuration of the Chien search unit 33 in the ECC circuit 13 according to the present embodiment.

Figure 9:
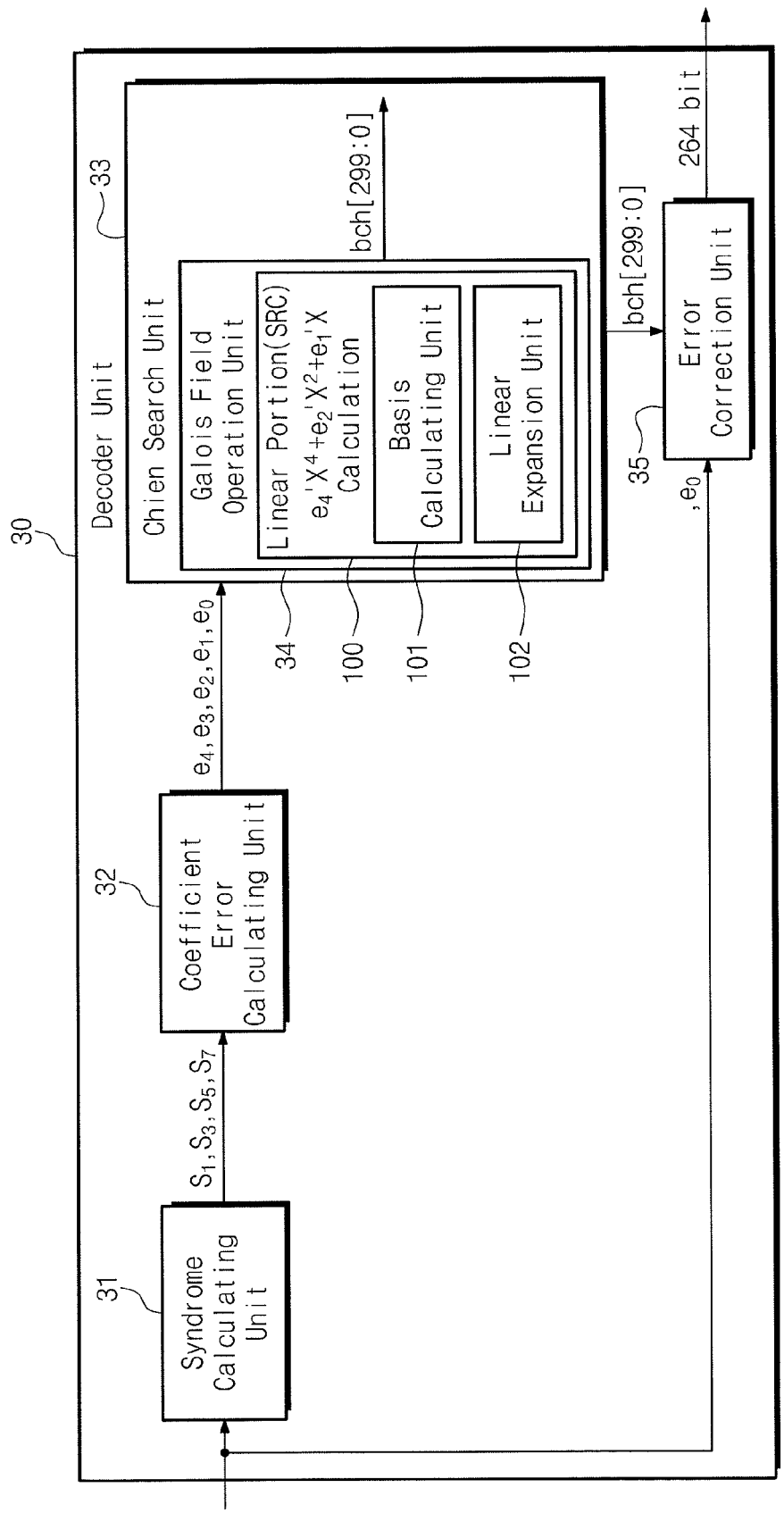
FIG. 9 illustrates a configuration of a decoder unit in an ECC circuit according to an embodiment.

FIG. 9 illustrates a configuration of a decoder unit 30 in the ECC circuit 13 according to an example. A circuit shown in FIG. 9 exemplifies the ECC circuit 13 which uses a BCH code having 300 bits (264 information data bits+36 parity bits) as a data correction unit and 4 error correctable bits from among the data correction unit.

Referring to FIG. 9, in the Galois Field operation unit 34 in the Chien search unit 33, an error locator polynomial $P(X)$ is operated by dividing the error locator polynomial $P(X)$ by a nonlinear term coefficient (for example, $e_3$ of $e_3X^3$) to generate a new error locator polynomial $P'(X)$, combining linear terms of the new error locator polynomial $P'(X)$, and operating the combined linear terms.

The Galois Field operation unit 34 in the Chien search unit 33 may operate the error locator polynomial $P(X)$, for example, $P(X) = e_4X^4 + e_3X^3 + e_2X^2 + e_1X + e_0$. At this time, X may be, for example, 9-bit mark values allocated to each 300 bits.

The syndrome calculating unit 31 may generate syndromes (S1, S3, S5, and S7) on the basis of 300-bit information data bits and a predetermined independent minimum polynomial. Also, the error coefficient calculating unit 32 may calculate coefficients of the error locator polynomial on the basis of syndromes (S1, S3, S5, and S7). The Chien search unit 33 may perform an operation on the error locator polynomial $P(X)$ through the Galois Field operation circuit 34, and obtain error positions in 300 bit information data.

Here, for the error locator polynomial, linearity of terms X, $X^2, X^4, X^8, X^{16}, \ldots$ may be admitted in the Galois Field, and the error locator polynomial $P(X)$ may be modified into $P(X) = s(X) + e_3X^3 + e_0'$. Here, $s(X)$ is a linear function, and $s(X) = e_4X^4 + e_2X^2 + e_1X$.

Furthermore, when the error locator polynomial $P(X)$ is divided by the nonlinear term coefficient ($e_3$), an error equation is $P'(X) = s'(X) + X^3 + e0'$, where $s'(X) = (e_4/e_3)X^4 + (e_2/e_3)X^2 + (e_1/e_3)X$, $e_0' = e_0/e_3$.

From this, since $e_0'$ may become a fixed value for all bits and $X^3$ becomes a fixed value for each bit, a circuit for calculation may be formed only from terms of the linear function $s'(X)$.

Since being a linear function of X where $s'(X) = (e_4/e_3)X^4 + (e_2/e_3)X^2 + (e_1/e_3)X$, in the Galois Field operation circuit 34, $s'(X)$ may be operated by using the basis calculating unit 101 and the linear expansion unit 102 through a circuit having a configuration as shown in FIG. 7.

That is, for the linear portion operation unit SRC 100 in the Galois Field operation circuit 34, the basis calculating unit 101 calculates the linear function $s'(X)$ for elements to be basis vectors from among elements X in a matrix operation and the linear expansion unit 102 expands (adds) the calculated result from the basis calculating unit 101 to obtain an output of the linear function for other elements X except the basis vectors. By adding a value of $X^3$, which is fixed for each bit, and $e_0'$, which is an integer, to the calculated result of $s'(X)$, an operation result of the error locator polynomial bch[299:0] may be obtained.

Thus, by dividing the error locator polynomial $P(X)$ by the nonlinear term coefficient $e_3$, $X^3$ may become a fixed value for each bit and $e_0'$ may become a fixed value for all bits. Also, for the linear function $s'(X) = (e_4/e_3)X^4 + (e_2/e_3)X^2 + (e_1/e_3)X$, calculation portions of the polynomial may be formed of one linear portion operation circuit 100 by performing operations by using the basis calculating unit 101 and the linear expansion unit 102. Thus, the number of elements used for operating the error locator polynomial may be reduced in the Galois Field operation circuit 34.

As described above, a size of the Galois Field operation circuit may be reduced by dividing the error locator polynomial by the nonlinear coefficient $e_3$. As shown in Table 3 of FIG. 10 (coefficient values according to the number of correction bits), an irregular condition (a condition that $e_3=0$) except a typical correction condition may exist.

That is, as shown in the table of FIG. 10, "for 1, 3, and 4 bit correction" and "for 2 bit correction" in a 4 bit correction circuit, generating conditions for error coefficients ($e_4, e_3, e_2, e_1, e_0$) may be different from each other. For example, "for 1, 3, and 4 bit correction" in a 4 bit correction circuit, in case where a syndrome S1 to be a basis is "S1=0" or "S1≠0", generating conditions for error coefficients ($e_4$, $e_3$, $e_2$, $e_1$, $e_0$) may be different. In this example, "for 1, 3 and 4 bit correction", when the syndrome S1 becomes 0, the error coefficient calculating unit 32 may generate error coefficients ($e_4$, $e_3$, $e_2$, $e_1$, $e_0$) by allowing the coefficient $e_3$ to be 0.

When the syndrome S1 is "S1=0" or "S1≠0", in order to satisfy the condition that the error coefficients ($e_4$, $e_3$, $e_2$, $e_1$, $e_0$) become differentiated in one circuit, the error locator polynomial according to correction conditions may be differentiated.

For example, for 1, 3 and 4 bit correction, when the syndrome "S1≠0 $e_3$≠0)", a first error locator polynomial P'(X)=s'(X)+$X^3$+e0' is used. For 4 bit correction, when the syndrome "S1=0", and for 2 bit correction, a second error locator polynomial P(X)=s(X)+$e_0$ may be used.

Figure 11:
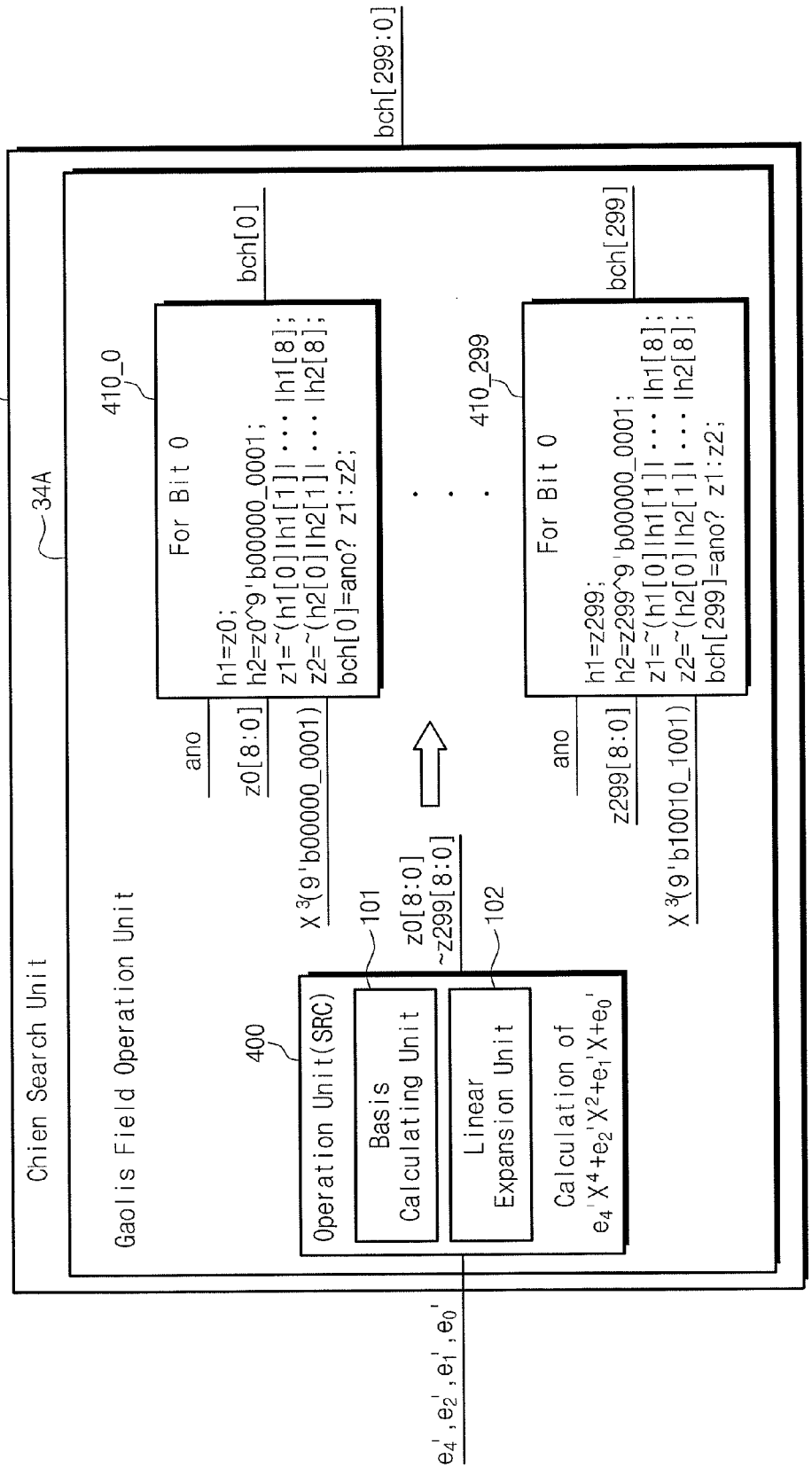
FIG. 11 illustrates an exemplary Galois Field operation circuit 34A where two error locator polynomials (a) and (b) are usable in an identical circuit.

FIG. 11 illustrates an exemplary Galois Field operation circuit 34A which may use the first and second error locator polynomials in an identical circuit. The Galois Field operation circuit 34A shown in FIG. 11 may calculate a polynomial $e_4'X^4+e_2'X^2+e_1'X+e_0'$ using the operating unit (SRC) 400. For the polynomial $e_4'X^4+e_2'X^2+e_1'X+e_0'$, $e_4'$ denotes $e_4/e_3$, $e_2'$ denotes $e_2/e_3$, and $e_0'$ denotes $e_0/e_3$. The operation unit 400 may calculate the polynomial $e_4'X^4+e_2'X^2+e_1X+e_0'$ in correspondence with each 300 bit data which is an error correction target, and output each bit circuit (410_0 to 410_299) corresponding to the calculated result z0[9:0] to z299[8:0].

When irregular condition, namely, a condition that $e_3$=0, occurs, the operation unit 400 may change "$e_4'$, $e_2'$, $e_1'$, $e_0'$" to "$e_4$, $e_2$, $e_1$, $e_0$" which are not divided by $e_3$, calculate $e_4X^4+e_2X^2+e_1X+e_0$, and output the calculated result z0[8:0] to z299[8:0] to each corresponding bit circuit 410_10 tChieno 410_299.

The operation unit 400 may include the basis calculating unit 101 and the linear expansion unit 102, and be configured to combine and calculate linear terms when operating the polynomial $e_4'X^4+e_2'X^2+e_1'X+e_0'$ or the polynomial $e_4X^4+e_2X^2+e_1X+e_0$.

In description below, for example, z0[8:0] is simply represented as z0 by omitting a symbol [8:0] portion representing a bit configuration (other signals h1 and h2 are the same). Signals ano, z0 to 299, and $X^3$ may be input to the bit circuit 410_0 to 410_299.

The signal ano input to the bit circuit 410_0 to 410_299 is a signal representing when "the syndrome S1=0" or a time of "2 bit correction", and a signal triggering whether selecting a following equation "h1=z0" or an equation "h2=z0^$X^3$", where ^ means an exclusive OR operation. For example, when the signal ano is an L level, h1 may be selected. When the signal ano is an H level, h2 may be selected.

The signal z0 to z299 input to the bit circuit 410_0 to 410_299 are signals output from the operation unit 400, as described above, which are calculation values (a 9 bit signal) of the polynomial $e_4'X^4+e_2'X^2+e_1'X+e_0'$ or of the polynomial $e_4X^4+e_2X^2+e_1X+e_0$. In addition, the signal $X^3$ may be calculation value of $X^3$ for each bit. For example, a value of $X^3$ corresponding to the signal z0 becomes 9 bit "9'b00000_0001", and a value of $X^3$ corresponding to the signal z299 becomes 9 bit "9'b10010_1001".

In the bit circuit 410_0 to 410_299, the calculated equation h1 is a value of $e_4X^4+e_2X^2+e_0$, where $X^3$ (a fixed value) is not substituted, while h2 is a value of $e_4'X^4+X^3+e_2'X^2+e_0'$, where $X^3$ (a fixed value for each bit) is substituted (namely, $e_3$≠0).

For example, in the bit circuit 410_0, it may become that "h1=z0" and "h2=z0^9'00000_0001".

Also, for equation "z1=(h1[0]| ... |h1[8])", z1 is a signal that each bit of 8 bits of h1[0] to h[8] is OR-operated and each of the OR-operated signals is inverted. For equation "z2≅(h2[0]| ... h2[8])", z2 is a signal that each bit of 8 bits of h2[0] to h[8] is OR-operated and each of the OR-operated signals is inverted. That is, z1 and z2 may be "1" (an H level) when an error is in a corresponding bit, may be "0" (an L level) when an error is not.

When the signal ano indicates that $X^3$ is not substituted (namely, e3=0), an equation "bch[i]=ano? z1:z2;", where i=0 to 299, selects z1 as bch[i]. When the signal ano indicates that $X^3$ is substituted (namely, e3≠0), the equation "bch[i]=ano? z1:z2;", where i=0 to 299, selects z2 as bch[i].

Thus, in the Galois Field operation circuit 34A shown in FIG. 11, according to a typical correction condition (namely, e3≠0), or an irregular condition (namely, e3=0), the error locator polynomial is differentiated and operated. In the Galois Field operation circuit 34A, in the case of the typical correction condition (namely, e3≠0), a size of an operation circuit may be reduced by dividing the error locator polynomial by the nonlinear coefficient $e_3$, and combining the linear terms.

In case of the irregular condition (namely, $e_3$=0), a size of an operation circuit may be reduced by combining and calculating linear terms of the error locator polynomial which is not divided by a coefficient $e_3$ of an element and, at the same time, neglecting an $X^3$ term.

In the above-described embodiment, although the ECC circuit 12 for 4 bit correction is exemplified, the present embodiment is not limited to the ECC circuit for 4-bit correction and an embodiment of the present embodiment may be applied to an ECC circuit for other bits.

As described above, a circuit size of the Chien search unit 33 (more accurately, the Galois Field operation circuit 34) may be reduced by dividing an error locator polynomial by a nonlinear coefficient and combining linear terms of the error locator polynomial. Accordingly, it is possible to mount an ECC circuit 13 including the Chien search unit 33 which is operable in high speed in the nonlinear semiconductor memory device 10.

Here, a correspondent relationship of the above-described embodiments is supplementarily described. That is, in the above-described embodiment, a memory device may correspond to the nonvolatile memory device (a NAND flash memory EEPROM) 10 shown in FIG. 1. Also, the ECC circuit may correspond to the ECC circuit 13 shown in FIG. 2, and a Chien search unit may correspond to the Chien search unit 33. A basis calculating unit, for example, may correspond to the basis calculating unit 101 in the Galois Field operation circuit 34 shown in FIG. 2, and a linear expansion unit may correspond to the linear expansion unit 102. A syndrome calculating unit may correspond to the syndrome calculating unit 31 in the decoder unit 30 shown in FIG. 2, a error coefficient calculating unit may correspond to the error coefficient calculating unit 32, and an error correction unit may correspond to the error correction unit 35.

In the above-described embodiments, the ECC circuit 13 may include the Chien search unit 33 determining whether there is an error in each bit of a data sequence by substituting an arbitrary element of the Galois Field GF($2^m$), where m is an integer, for a substituted value X of an error locator polynomial (for example, P(X)=$e_4X^4+e_3X^3+e_2X^2+e_1X+e_0$). The Chien search unit 33 may determine whether an error is in a bit by taking a coefficient e3 multiplied by an order $X^3$ whose linearity is not admitted from among each order of an error locator polynomial as a nonlinear coefficient, dividing the error locator polynomial into a first location equation ($e_4X^4$+

$e_2X^2+e_1X$) including orders whose linearity is admitted, and a second location equation ($e_3X^3+e_0$) including orders whose linearity is not admitted, substituting the substituted value for each order of a third location equation s'X which is output by dividing the first location equation ($e_4X^4+e_2X^2+e_1X$) by the nonlinear coefficient $e_3$, substituting the substituted value for a fourth location equation ($X^3+e_0'$) which is output by dividing the second location equation ($e_3X^3+e_0$) by the nonlinear coefficient $e_3$, and performing an XOR operation on a result of the third location equation s'X and a result of the fourth location equation ($X^3+e_0'$).

In the ECC circuit 13 of this configuration, for the Chien search unit 33 (or the Galois Field operation circuit 34), for example, an error locator polynomial $P(X)=e_4X^4+e_3X^3+e_2X^2+e_1X+e_0$ is divided by a coefficient e3 of a nonlinear term $X^3$, and a new error locator polynomial $P'(X)=(e_4/e_3)X^4+X^3+(e_2/e_3)X^2+(e_1/e_3)X+e_0/e_3$ is obtained. Here, the term $X^3$ becomes a fixed value for each bit, and $e_0'$ may be an integer.

From the new error locator polynomial P'(X), a linear function $s'(X)=(e_4/e_3)X^4+(e_2/e_3)X^2+(e_1/e_3)X$ may be generated by combining linear terms for X in P'(X). When the linear function s'(X) is calculated, the basis calculating unit 101 calculates a linear function $s'(X)=e_4'X^4+e_2'X^2+e_1'X$ for basis elements which are linearly independent on the Galois Field GF($2^m$). The linear expansion unit 102 adds operation results of the basis calculating unit 101 in order to calculate the linear function s'(X) for remaining ($2^m-1-m$) elements other than linearly independent m elements. Thus, a calculation circuit for the linear function s'(X) may be simplified.

Thus, since the calculation circuit for the linear function s'(X) is simplified and the term $X^3$ has a fixed value for each bit, a circuit for operating the error locator polynomial may be simplified and a size of an operation circuit for the error locator polynomial may be reduced in the ECC circuit 13. Therefore, the ECC circuit 13 for obtaining roots of the error locator polynomial in high speed may be realized in a circuit size which allows the ECC circuit 13 to be mounted in a semiconductor memory (the nonvolatile semiconductor memory device 10).

In the above-described embodiment, the Chien search unit 33 may include the basis calculating unit 101 calculating linearly independent m elements among ($2^m-1$) elements when the ($2^m-1$) elements, which are represented as a vector by m bits of the Galois Field GF($2^m$), where m is an integer, are substituted for the third location equation s'X, and the linear expansion unit 102 obtaining ($2^m-1-m$) elements except the m elements among the ($2^m-1$) elements as combinations of the m elements.

In the ECC circuit 13 of this configuration, the Chien search unit 33 may include the basis calculating unit 101 and the linear expansion unit 102. The basis calculating unit 101 may calculate the linear function $s'(X)=e_4'X^4+e_2'X^2+e_1'X$ for linearly independent m elements on the Galois Field GF($2^m$). The linear expansion unit 102 may expand (add) operation results output from the basis calculating unit 101 in order to calculate the linear function s'(X) for remnants ($2^m-1-m$) elements except the linearly independent m elements.

Thus, the ECC circuit 13 may reduce a size of a circuit used for calculating the linear function s'(X) by combining linear terms in the Chien search unit 33.

In the above-described embodiment, the memory device (the nonvolatile semiconductor memory device 10) may include the ECC circuit 13 and the ECC circuit 13 may include the syndrome calculating unit 31 calculating syndromes from an input data sequence, the error coefficient calculating unit 32 calculating coefficients of an error locator polynomial from the syndromes, the Chien search unit 33 substituting values, which indicate data bit positions of the data sequence, and the coefficients for the error locator polynomial and outputting an error detection signal, which denotes whether an error is in each bit of the data sequence, and an error correction unit 35 correcting errors of data bits in the data sequence by using the error detecting signal and outputting the error corrected data.

In the memory device (the nonvolatile semiconductor memory device 10) of this configuration, when calculating the error locator polynomial, the Chien search unit 33 may divide the error locator polynomial P(X) by the coefficient $e_3$ of the nonlinear term $X^3$, and obtain a new error locator polynomial P'(X). Also, the Chien search unit 33 may generate and calculate the linear function s'(X) which combines the linear terms for X in the new error locator polynomial P'(X).

Due to this, a circuit size of the ECC circuit 13 mounted in the memory device (the nonvolatile memory device 10) may be reduced. Therefore, the memory device (the nonvolatile semiconductor memory device 10) may include the ECC circuit 13 operable in high speed in an on-chip type.

By way of summation and review, according to embodiments, an error correction code circuit divides an error locator polynomial by a coefficient of a nonlinear term of the error locator polynomial, and, at the same time, combines and calculates linear terms of the divided error locator polynomial. Accordingly, a size of a circuit for operating the error locator polynomial in the error correction code circuit may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An error correction code (ECC) circuit comprising a Chien search unit configured to determine whether there is an error in each bit of a data sequence by using an arbitrary element on a Galois Field GF($2^m$), where m is an integer, as a substitution value of an error locator polynomial, wherein the Chien search unit, selects a coefficient of a nonlinear term from among terms of the error locator polynomial as a nonlinear coefficient;

separates the error locator polynomial into a first location equation including only linear terms and a second location equation including only nonlinear terms;

determines a third location equation by dividing the first location equation by the nonlinear coefficient;

determines a fourth location equation by dividing the second location equation by the nonlinear coefficient; and determines whether there is an error for each of the bits by performing an XOR operation on a result of the third location equation using the substitution value and a result of the fourth location equation using the substitution value.

2. The ECC circuit as claimed in claim 1, wherein the Chien search unit comprises,
   a basis calculating unit configured to calculate linearly independent m elements from among ($2^m-1$) elements when performing operations by substituting ($2^m-1$) elements, which are represented as a vector with m bits on the Galois Field GF($2^m$), where m is an integer, for the third location equation; and
   a linear expansion unit configured to obtain ($2^m-1-m$) elements except the m elements from among the ($2^m-1$) elements as combinations of the m elements.

3. The ECC circuit as claimed in claim 1, wherein a number of XOR elements for performing the XOR operations is less than $(n+1)\times(2^m-1)\times m(m-1)/2+n\times(2^m-1)\times m$, where n is an order of the error locator polynomial.

4. The ECC circuit as claimed in claim 3, wherein the number of XOR elements for performing the XOR operations is equal to n.

5. The ECC circuit as claimed in claim 1, wherein the fourth location equation is constant for each bit.

6. A memory device comprising an error correcting code (ECC) circuit, wherein the ECC circuit comprises,
   a syndrome calculating unit configured to calculate syndromes from a data sequence input thereto;
   an error coefficient calculating unit configured to calculate coefficients of an error locator polynomial from the syndromes;
   a Chien search unit configured to determine whether there is an error in each bit of the data sequence by taking an arbitrary element of a Galois Field GF($2^m$), where m is an integer, as a substitution value of the error locator polynomial, and to output an error detection signal; and
   an error correction unit configured to correct errors of data bits in the data sequence by using the error detection signal, and to output error corrected data bits,
   wherein the Chien search unit
   selects a coefficient of a nonlinear term from among terms of the error locator polynomial as a nonlinear coefficient;
   separates the error locator polynomial into a first location equation including only linear terms and a second location equation including only nonlinear terms;
   determines a third location equation by dividing the first location equation by the nonlinear coefficient;
   determines a fourth location equation by dividing the second location equation by the nonlinear coefficient; and
   determines whether there is an error for each of the bits by performing an XOR operation on a result of the third location equation using the substitution value and a result of the fourth location equation using the substitution value.

7. An error correction code (ECC) circuit comprising a search unit configured to determine whether there is an error in each bit of a data sequence by using an arbitrary element on a Galois Field GF($2^m$), where m is an integer, as a substitution value, wherein the search unit includes,
   a basis calculating unit that generates basis vectors from elements that are linearly independent on the Galois Field GF($2^m$) based on an error locator polynomial that is a linear function using the substitution value; and
   a linear expansion unit that calculates remaining elements that are not linearly independent on the Galois Field by performing XOR operations on results output from the basis calculating unit using the substitution value, wherein a number of XOR elements in the linear expansion unit for performing the XOR operations is less than $(n+1)\times(2^m-1)\times m(m-1)/2+n\times(2^m-1)\times m$, where n is an order of the error locator polynomial.

8. The ECC circuit as claimed in claim 7, wherein the number of XOR elements for performing the XOR operations is equal to n.

* * * * *